US012561501B2

(12) United States Patent　(10) Patent No.:　US 12,561,501 B2

Hay et al.　(45) Date of Patent:　Feb. 24, 2026

(54) SYSTEM AND METHOD FOR EXCESS GAS UTILIZATION

(71) Applicant: SCHLUMBERGER TECHNOLOGY CORPORATION, Sugar Land, TX (US)

(72) Inventors: Glen Andrew Hay, Calgary (CA); Lante Carbognani, Calgary (CA); Andrew Emil Pomerantz, Cambridge, MA (US); Victor Rodriguez, Calgary (CA)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 18/718,605

(22) PCT Filed: Mar. 22, 2023

(86) PCT No.: PCT/US2023/015895

§ 371 (c)(1),
(2) Date: Jun. 11, 2024

(87) PCT Pub. No.: WO2023/183380

PCT Pub. Date: Sep. 28, 2023

(65) Prior Publication Data

US 2024/0403523 A1　Dec. 5, 2024

Related U.S. Application Data

(60) Provisional application No. 63/269,822, filed on Mar. 23, 2022.

(51) Int. Cl.
*G06F 30/28*　(2020.01)

(52) U.S. Cl.
CPC ................................... *G06F 30/28* (2020.01)

(58) Field of Classification Search
CPC ................................. G06F 30/20; G06F 30/28
See application file for complete search history.

(56) References Cited

U.S. PATENT DOCUMENTS

| | | | |
|---|---|---|---|
| 7,873,442 | B2 | 1/2011 | Tsui |
| 10,135,253 | B2 | 11/2018 | Lof et al. |
| | | (Continued) | |

FOREIGN PATENT DOCUMENTS

| | | |
|---|---|---|
| JP | 2021189845 A | 12/2021 |
| KR | 1020210012630 | 2/2021 |

OTHER PUBLICATIONS

Hamidzadeh et al. "Development of a multi-objective decision-making model to recover flare gases in a multi flare gases zone" Energy vol. 203 [retrieved on Oct. 28, 2024] (Year: 2020).*

(Continued)

*Primary Examiner* — Emerson C Puente
*Assistant Examiner* — Alfred B Wechselberger
(74) *Attorney, Agent, or Firm* — Jeffrey D. Frantz

(57) ABSTRACT

A method includes adding a core logic block to a system design, in which the core logic block is representative of a process for converting excess gas provided by a feed logic block into a product, connecting the core logic block to the feed logic block, identifying an adjustment to the excess gas provided by the feed logic block, the product produced by the core logic block, or both, adding a utility logic block to the system design to implement the adjustment to the excess gas provided by the feed logic block, the product produced by the core logic block, or both, connecting the utility logic block to the feed logic block, the core logic block, or both, determining a power balance for the system design, and outputting the system design in response to determining that the power balance for the system design is within an acceptable range.

20 Claims, 6 Drawing Sheets

(56)                    References Cited

U.S. PATENT DOCUMENTS

| | | |
|---|---|---|
| 2006/0036448 A1 | 2/2006 | Haynie et al. |
| 2019/0041813 A1* | 2/2019 | Horn .................... G05B 13/048 |

OTHER PUBLICATIONS

Anosike, N. "Technoeconomic Evaluation of Flared Natural Gas Reduction and Energy Recovery using Gas-To-Wire Scheme" [Thesis] University of Cranfield, School of Engineering [retrieved on Oct. 28, 2024] (Year: 2013).*

Sarkar et al. "Integrating flare gas with cogeneration system: Hazard identification using process simulation" Journal of Loss Prevention in the Process Industries, vol. 74 [retrieved on Oct. 28, 2024] (Year: 2021).*

Asadi et al. "Technical evaluation and optimization of a flare gas recovery system for improving energy efficiency and reducing emissions" Energy Conversion and Management, vol. 236 [retrieved on Nov. 1, 2024] (Year: 2021).*

Jagannath, A. "Modeling and Optimization of Gas Networks in Refinery" [Thesis] B. Tech, Anna University, India (Year: 2012).*

Dimian, A. "Introduction in Process Simulation" Chapter 2, Computer Aided Chemical Engineering. vol. 35. ISSN 1570-7946. http://dx.doi.org/10.1016/B978-0-444-62700-1.00002-4 (Year: 2014).*

Khalili-Garakani et al. "Enviro-economic investigation of various flare gas recovery and utilization technologies in upstream and downstream of oil and gas industries" Journal of Cleaner Production, vol. 346 (2022); [Published on Mar. 7, 2022] [Retrieved on Oct. 30, 2024] (Year: 2022).*

Alberghina, E. "Techno-economic comparison between Dimethylether and Methanol synthesis processes" [Thesis] Politecnico Milano [retrieved on Nov. 1, 2025] (Year: 2021).*

Lu, X. "Development and Application of Advanced Models for Steam Hydrogasification: Process Design and Economic Evaluation" [Thesis] Chemical and Environmental Engineering; University of California, Riverside [retrieved on Nov. 1, 2025] (Year: 2012).*

Sarcheshmehpoor, M. "Evaluation of a gas refinery using exergy-based methods" [Thesis] Technical University of Berlin [retrieved on Nov. 1, 2025] (Year: 2019).*

Search Report and Written Opinion of International Patent Application No. PCT/US2023/015895 on Jul. 11, 2023; 10 pages.

* cited by examiner

SYSTEM AND METHOD FOR EXCESS GAS UTILIZATION

CROSS-REFERENCE TO RELATED APPLICATIONS

This application is a National Stage Entry of International Patent Application No. PCT/US2023/015895, filed on Mar. 22, 2023, which claims priority from and benefit of U.S. Provisional Application No. 63/269,822, entitled "METHOD FOR GAS MONETIZATION OPTIMIZATION," filed Mar. 23, 2022, which is hereby incorporated by reference in its entirety for all purposes.

BACKGROUND

The present disclosure generally relates to a method to monetize excess gas and, more particularly, to a method to monetize excess gas in an environmentally and economically optimized process.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as an admission of any kind.

In some instances, facilities may produce or process oil and gas such that not all of the gas can be economically delivered to market. In such cases, when the cost to bring the gas to market exceeds the revenue that can be generated by selling the gas, the excess gas may be vented (e.g., released into the atmosphere) or flared (e.g., combusted). Traditionally, vented, stranded, or flared gas alternative studies are completed on a case-by-case basis with a limited selection of options, resulting in lengthy studies that may utilize custom dedicated models to obtain the mass and energy balance for each process and/or subprocesses. In some cases, such studies may also include economic and/or emissions evaluations. Accordingly, improved techniques for determining how best to utilize excess gas are needed.

SUMMARY

A summary of certain embodiments described herein is set forth below. It should be understood that these aspects are presented merely to provide the reader with a brief summary of these certain embodiments and that these aspects are not intended to limit the scope of this disclosure.

Certain embodiments of the present disclosure include techniques for determining an optimized environmental and economical gas monetization solution depending upon a determined producing environment. In some embodiments, production facility configurations for conversion of a produced gas to a sellable product may be automatically generated. In embodiments, the produced gas may be an excess gas produced in excess by a primary production facility that would otherwise vent or flare such excess gas. In some embodiments, a process identification workflow that allows producing parameters to interact may be used to generate an optimized production facility configuration for producing a gas product from a main feed gas stream produced in excess by a primary production facility. The producing parameters may include, for example region specific economic inputs, carbon dioxide emissions payments, product prices, equipment and utility costs, capital expenses, operating expenses, and so forth. The producing parameters may include, for example, the main feed gas stream composition, a plurality of potential gas products, power, and utilities associated with a plurality of known gas monetizing processes. In some embodiments, the producing parameters may include predicted carbon dioxide emission reductions and/or other greenhouse gas emission reductions. Production facility configurations may account for bias of capital expenditure, pay back periods, economic risks, and emission reductions achieved.

Various refinements of the features noted above may be undertaken in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings, in which.

DETAILED DESCRIPTION

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As used herein, the terms "connect," "connection," "connected," "in connection with," and "connecting" are used to mean "in direct connection with" or "in connection with via one or more elements"; and the term "set" is used to mean "one element" or "more than one element." Further, the terms "couple," "coupling," "coupled," "coupled together," and "coupled with" are used to mean "directly coupled together" or "coupled together via one or more elements."

In addition, as used herein, the terms "real time", "real-time", or "substantially real time" may be used interchangeably and are intended to described operations (e.g., computing operations) that are performed without any human-perceivable interruption between operations. For example, as used herein, data relating to the systems described herein may be collected, transmitted, and/or used in control computations in "substantially real time" such that data readings, data transfers, and/or data processing steps occur once every second, once every 0.1 second, once every 0.01 second, or even more frequent, during operations of the systems (e.g., while the systems are operating). In addition, as used herein, the terms "automatic" and "automated" are intended to describe operations that are performed or are caused to be performed, for example, by a greenhouse gas emission analysis system (i.e., solely by the greenhouse gas emission analysis system, without human intervention).

Figure 1:
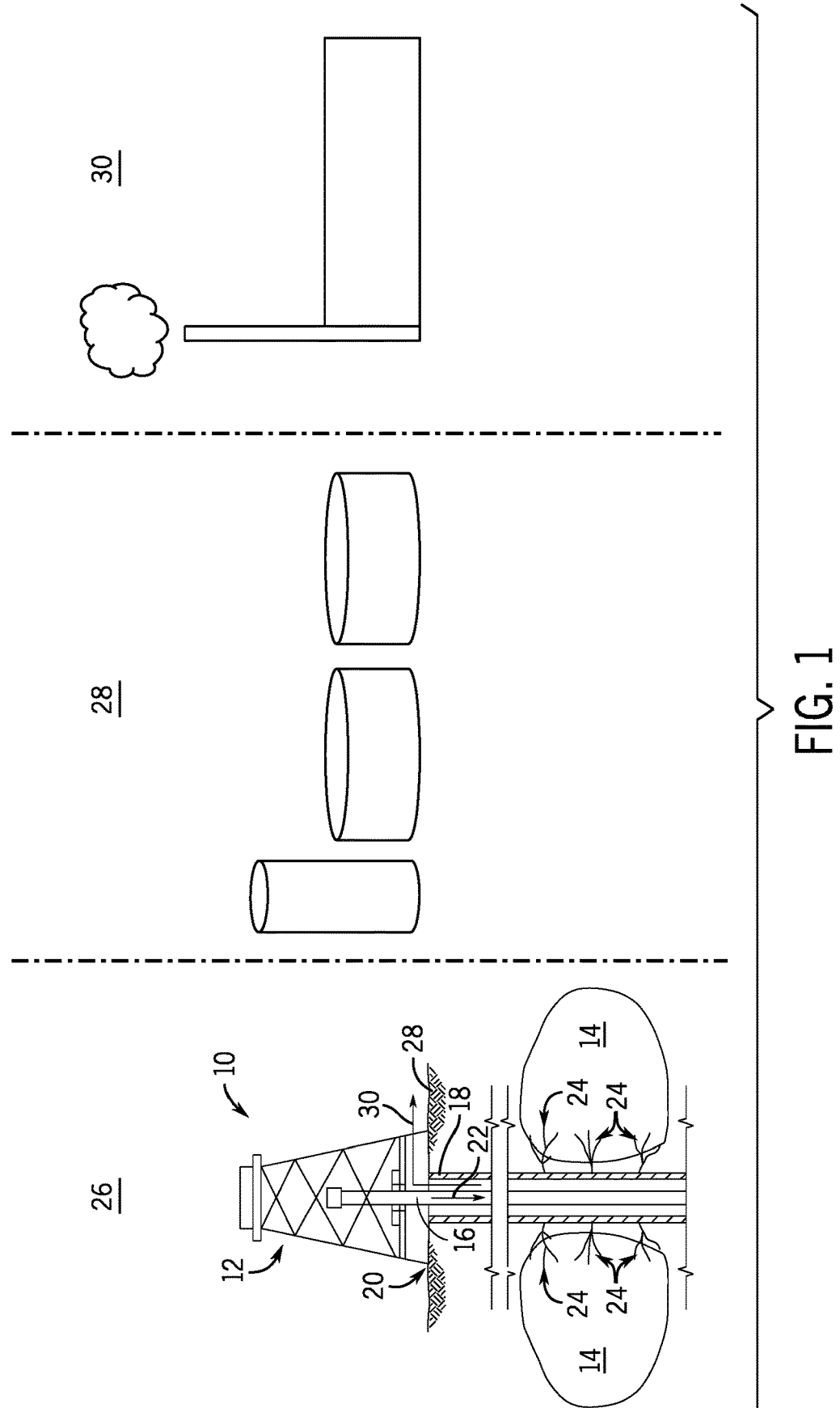
FIG. 1 illustrates phases of oil and gas production, in accordance with embodiments of the present disclosure.

FIG. 1 illustrates phases of oil and gas production. A well site 10 has a drilling rig 12 for extracting oil and/or gas from one or more reservoirs 14. During operation, a drilling string 16 may be lowered into and out of a wellbore 18 of a well 20 to drill the wellbore 18, as well as to position downhole well tools within the wellbore 18 to facilitate completion and production operations of the well 20. It should be understood that the disclosed techniques may be applied to both onshore and offshore wells. In some embodiments, a hydraulic fracturing fluid may be introduced into the well 20 through the drilling string 16, as illustrated by arrow 22, to create fractures 24 in the subterranean formation to facilitate production of oil and/or gas resources from the well 20. It should be understood, however, that the disclosed techniques may be used in both conventional and unconventional wells. During operation of the well 20, excess gas may be produced, which is typically flared, vented, or otherwise discarded. The well site 10 is generally considered in the upstream 26 phase of oil and gas production. Produced oil and gas from the well site 10 may be transported (e.g., via truck, pipeline, etc.) to a midstream 28 phase for storage (e.g., in storage tanks) and/or midstream processing. Oil and gas may subsequently be transported to a downstream 30 phase for refining and/or production. Midstream 28 and downstream 30 activities may also generate excess gas that may be used to produce a product to be brought to market. Accordingly, the disclosed techniques may be utilized in upstream, midstream, or downstream locations that produce excess gas.

The oil and gas industry may produce or process oil and gas in scenarios in which it may not be practical and/or economical to deliver all of the gas in a system to market. In such cases, the excess gas may be vented (e.g., released into the atmosphere) or flared (e.g., combusted), or otherwise disposed of. For example, excess gas may be vented or flared when the cost to bring the excess gas to market exceed the revenues that can be generated by bringing the excess gas to market. The disclosed techniques help to identify a product that may be less costly to bring to market and/or more profitable to bring to market, and in some cases, techniques for generating the identified product. Such identified product might then be used locally (gas recovery/injection, captive electricity, heating source, etc.), as a market product (pressurized raw gas, power/electricity, computing, etc.), or in treatment or processing units (liquefied petroleum gas/compressed natural gas/liquefied natural gas, bio-feed/plant water, petrochemicals, net-zero carbon fuels, etc.). In some embodiments, the disclosed techniques may produce additional environmental benefits, economic benefits, or both, when compared to venting or flaring the excess gas. When there are many candidate products to produce using the excess gas, a particular product may be identified based on various technical and/or economic factors. Further, the disclosed techniques may be utilized to determine which product is most environmentally and/or economically beneficial in a particular situation.

Figure 2:
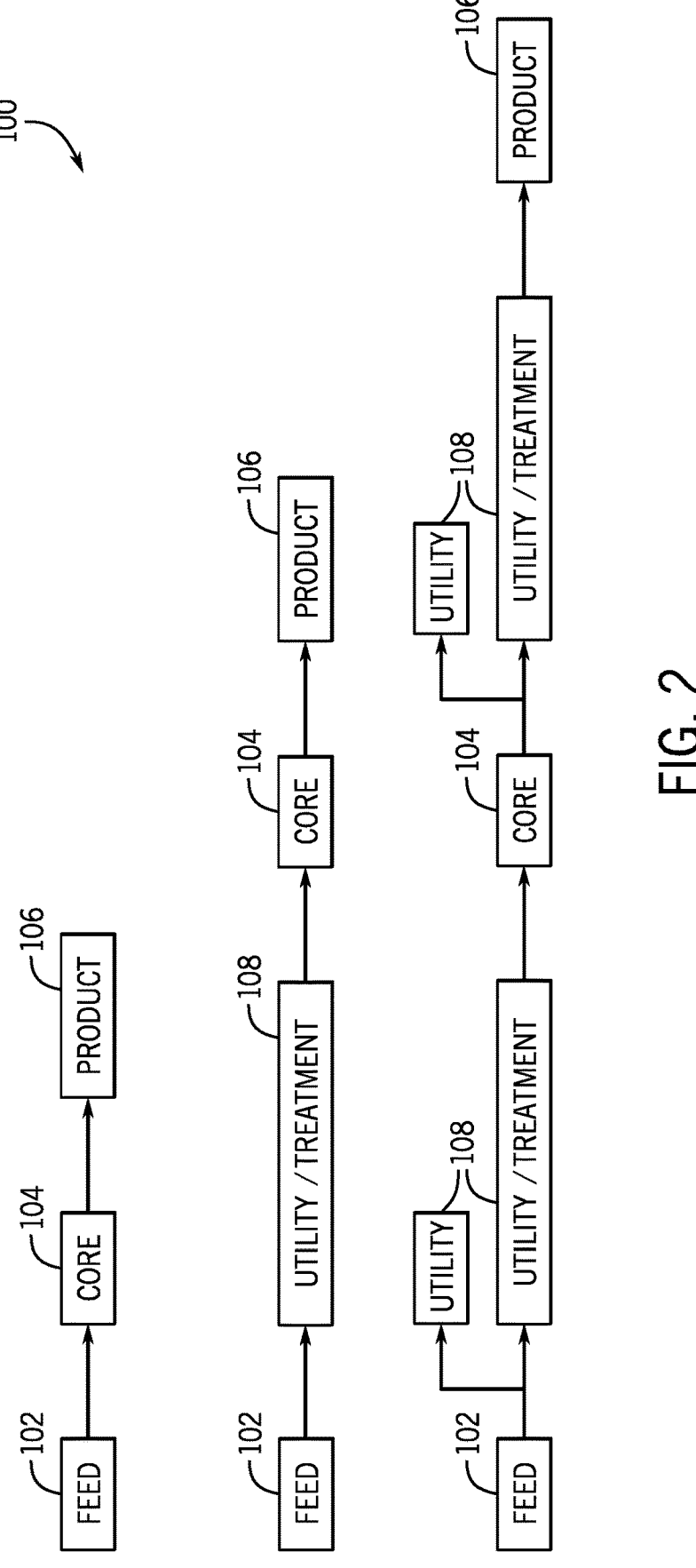
FIG. 2 illustrates development of a plan for utilizing excess gas produced by the phases of FIG. 1, in accordance with embodiments of the present disclosure.

The disclosed techniques include using a logic-driven algorithm that automatically generates alternative facility configurations using excess (e.g., flared or vented) gas, which may be methane rich, nitrogen rich, moisture rich, and so forth, as the main feed. FIG. 2 illustrates an example schematic 100 of logic blocks for generating facility configurations, which may use excess gas as the main feed. For example, the disclosed techniques may utilize a process identification language that allows all the feed, product, power, and utilities associated with various processes to be used to generate total facility solutions. Each logic block may be defined via a process identification language that specifies various parameters of the respective block. For example, the process identification language may define a data structure used to define various available logic blocks. Each logic block may be represented by a file or portion of code that specifies various parameters of a respective process associated with the logic block in accordance with the process identification language. This may include, for example, specification of characteristics of inputs, outputs, power needs, etc. Specifically, the code or file for a logic block may specify characteristics of input/output flows (e.g., temperature, pressure, flow rate, chemical makeup of the flows, such as sulfur content, water content, mercury levels, BTU content), ambient conditions associated with the process (e.g., ambient temperature, ambient pressure, humidity, etc.), information about the equipment used to implement processes represented by logic blocks (e.g., weight, mass, footprint space, cost, cost to operate, etc.), and so forth. The process identification language is flexible and easy for a layperson to use, making it easy to incorporate new technologies and/or processes by creating new logic blocks that can be made available to the system. Further, coordination between process logic blocks based on the process identification language allows the inlets versus outlets to be balanced for each solution generated. In some embodiments, region-specific economic inputs on carbon dioxide (CO2) penalties, carbon dioxide equivalent (CO2e) penalties, product prices, equipment costs, utility costs, and so forth, might be used to report these solutions with associated capital expenditures and operating expenses. In some embodiments, a process simulation tool may be used to run each process logic block, resulting in accurate material and energy balances, which may include predicted CO2 or greenhouse gas emission reductions.

As shown in FIG. 2, various aspects of a process for utilizing excess gas are represented by logic blocks. A feed block 102 represents excess gas being provided to a system. These blocks may act as the main feed to the process facility being generated for each scenario. The feed blocks ensure that fluids generated and input into other logic blocks are consistent and contribute to the generic usage of the disclosed techniques. As previously described, a particular feed block 102 may include characteristics of the excess gas being fed to the system, such as flow rate, temperature ranges, chemical makeup, pressure ranges, etc. A core block 104 represents a process for converting excess gas into an identified product 106. For example, a core block 104 may represent flare gas recovery systems (e.g., using additional pressurization with compressor units to return expected continuous volumes of vented gas back into the process facility for utilization), flare gas injection systems (e.g., similar to flare gas recovery systems but relies on ejectors with either a high-pressure motive gas or liquid to bring vented gas up to pressure where it can be further utilized), gas to power/wire (e.g., generating electrical power by combusting the vented gas might be completed through combustion turbines, gas engines, raised steam turbines, or other configuration to sell power to the grid or to nearby facilities), solid oxide fuel cell to power (e.g., power generation through a solid oxide fuel cell might be an alternative route for electrical production from the vented gas, and may also create purified carbon dioxide as a by-product that can be applied for carbon capture and storage solutions), solvent extraction for liquefied petroleum gas (e.g., separation of the vented gas by solvent extraction and separation columns into more easily sellable lean compressed gas and hydrocarbon liquids), compression to compressed natural gas and/or petroleum natural gas (e.g., separation of the vented gas by a cryogenic process into more easily sellable lean compressed gas and hydrocarbon liquids), cryogenic to compressed natural gas and/or petroleum natural gas, reformation to synthetic fuels (e.g., conversion of the gas to synthetic liquid fuels by means of a methane reforming unit to generate synthesis gas for downstream Fischer-Tropsch style reaction synthesis), reformation to methanol (e.g., conversion of the gas to methanol by means of steam methane reforming to generate synthesis gas for downstream catalytic reaction), reformation to ammonia (e.g., conversion of the gas to ammonia liquid by means of steam methane reforming to generate synthesis gas for downstream catalytic reaction), and so forth. It should be understood, however, that these are merely examples and that other embodiments utilizing other processes are also envisaged.

In some embodiments, core blocks 104 may include signal values that specify operating characteristics or parameters (e.g., pressure, heating value, temperature, feed gas composition contaminants) of the respective process represented by the core block. One or more automated simulation engines may be used to analyze the system and determine whether a particular feed block 102 matches the operating characteristics or parameters of a respective core block 104. The automated simulation engines may be software defined by instructions or code stored in memory of one or more computing devices (e.g., a server, a workstation, a personal computer, a desktop computer, a laptop computer, a tablet, a mobile device, a smartphone, etc.). To run one or more of the automated simulation engines, instructions may be retrieved from memory and executed by one or more processors to run the automated simulation engines, which may be included in a software package or be its own software package. In embodiments, thermodynamic property packages might be created for one or more of the simulation engines. The thermodynamic property packages can be setup for lighter product slates (CNG, LPG, etc.), as well as heavier component slates (e.g., synthetic fuels) ensuring the simulation block models contain the same packages for potential integration. For example, use of one or more rigorous thermodynamic simulators may allow for matching pipeline specs within a system.

If a particular feed block 102 does not match the operating characteristics or parameters of a respective core block 104, the automated simulation engine may select one or more utility/treatment blocks 108 from one or more available utility/treatment blocks 108 and add the selected one or more utility/treatment blocks 108 to the system to condition the feed to match the signal values of the core block 104. Example utility/treatment blocks 108 may include, for example, generating power through combustion or steam, receiving grid power, removal of contaminants (e.g., Hydrogen sulfide, sulfur, mercury, inert materials, water, etc.), compression of a gas to a set pressure, pumping liquids to a set pressure, and so forth. In some embodiments, utility/treatment blocks 108 may include standalone simulation models that work in conjunction with the automated simulation engine via the process identification language.

The automated simulation engine may analyze the system again to determine whether the inputs and outputs between blocks meet certain parameters (e.g., signal values) and/or fall within acceptable value ranges. If not, the automated simulation engine may add one or more additional utility/treatment blocks 108 to the system. In the embodiment shown in FIG. 2, an additional utility/treatment block 108 has been added between the core block 104 and the product block 106 to condition the output of the core block 104. However, it should be understood that the embodiment shown in FIG. 2 is merely an example that has been kept simple for ease of understanding. However, it should be understood that, as described in more detail below, other embodiments, including more complex embodiments are also envisaged. For example, a system may include multiple utility/treatment blocks 108 disposed between the feed block 102 and the core block 104, and/or multiple utility/treatment blocks 108 disposed between the core block 104 and the product block 106. The automated simulation engine may continue recursively analyzing and adding utility/treatment blocks 108 until a balanced system is reached (e.g., inputs, outputs, operating conditions of all blocks meet specifications and/or set acceptable ranges, power balance, energy balance, mass balance, utility balance, etc.), or until the automated simulation engine determines that no solution can be reached utilizing the feed block 102 and the core block 104. Correspondingly, if a feed rate is greater than a single solution's maximum flow rate, the automated simulation engine may generate multiple process trains of the same or different process trains. For example, if a feed gas has a rate a 3 million standard cubic feet per day (MMSCFD), and the solution generated by the automated simulation engine has a maximum flow rate of 1 MMSCFD, the automated simulation engine will generate a result having at least three solution trains of 1 MMSCFD each. As shown in FIG. 2, in some embodiments, the automated simulation engine may trim a portion of the feed or produced gas and provide the trimmed feed to an additional utility/treatment block 108 in order to achieve a balanced system. Determinations as to the amount of trim may be determined by the automated simulation engine iteratively (e.g., based on simulation studies) as the system is being developed.

After a balanced system has been achieved, the automated simulation engine may calculate capital investment for the equipment included in the developed system, operating costs for the developed systems, projected emissions data, and so forth for the developed system. The automated simulation engine or an additional automated simulation engine may develop one or more additional system options based on different available technologies (e.g., using different core blocks 104 and/or different combinations of utility/treatment blocks 108 and core blocks 104). These additional systems may be developed in parallel, one after the other, or some combination of both. In some embodiments, user may provide inputs identifying particular technologies (e.g., core blocks 104 and/or products) of interest to include, identifying particular technologies to exclude, specifying preferences regarding priorities for cost (e.g., preference for larger initial investment and lower operating costs or smaller initial investment and higher operating costs), specifying preferences regarding priorities for emissions, number of solutions provided, and so forth, which may be used to develop solutions and/or identify recommended solutions (e.g., configurations of logic blocks built by the automated simulation engine). Once a number of solutions have been identified, a report may be generated that identifies one or more solutions for utilizing the excess gas and various metrics and/or performance indicators for the identified solutions (e.g., capital expenditure, operating costs, pay back periods, economic risks, emission reductions achieved, weight or mass, footprint space, etc.).

To obtain a capital expenditure estimate for any given scenario, a list of equipment might be first identified. This equipment list may include a plurality of the known equipment that are contained within each scenario's modules (e.g., compressors, absorbers, pumps, etc.). In order to automate the proposed method, a piece of equipment that might be included in core blocks and/or utility blocks may be given a specific label (followed by the equipment number) in order to be picked up. Each such piece of equipment that is identified may then be saved in memory and used when the economic calculations are performed. An example of a few of the different possible labels are shown below in Table 1:

| Equipment Tag | Description | Example |
|---|---|---|
| AC | Air Coolers | AC-1 |
| CP | Compressors | CP-1 |
| T | Turbines | T-2 |
| P | Pumps | P-4 |

In some embodiments, when possible equipment lists are created, one or more additional properties for each piece of equipment may be included. These additional properties may include, for example, an energy value, a heat transfer coefficient factor, a volumetric flowrate, and so forth, which may depend on the type of equipment (e.g., air coolers may be given an energy value, whereas heat exchangers may be given a heat transfer coefficient factor, and so forth). In some embodiments, these additional properties may be tied to a specific piece of equipment (e.g. AC-1) and then can be used to estimate a cost (e.g., a class 4 cost to estimate viability/economic value of the proposed solution to utilize the excess gas).

Economic calculations may be performed once each scenario evaluation is completed. Inputs to the economic calculations may include, for example, utilities/labor, products, emissions payments, and/or plant economics. Utilities/labor may include, for example, the cost of a pre-defined list of utilities, including electricity from various sources, steam, water, and labor, transportation associated considerations. Utilities/labor may be utilized to calculate the operational expenses for each scenario (e.g., for any utilities that each scenario consumes). Additionally, a carbon dioxide value (e.g., in tons per year) can be input for each utility if the effect on carbon dioxide or other gas production is known and the customer would like to be considered. Products may include, for example, the price for each product, including consideration for any transportation costs to associated with bringing the product to market. For example, for each scenario, products obtained may be combined with economic values to calculate the revenue for a given scenario. Additionally, in some embodiments, multiple specifications can be entered for each product and used to determine whether more utility blocks should be added (e.g., compressed natural gas delivery pressure may justify an additional compression train). Emissions payments may include any cost incurred by emitting $CO_2$ and other greenhouse gases to the atmosphere. Plant economics may allow a user to manually input capital expenditure, operational expenses, and operating days for each core and utility block/module. This can be used whenever a class 2 or better economic estimate is available for any given module/plant.

Figure 3:
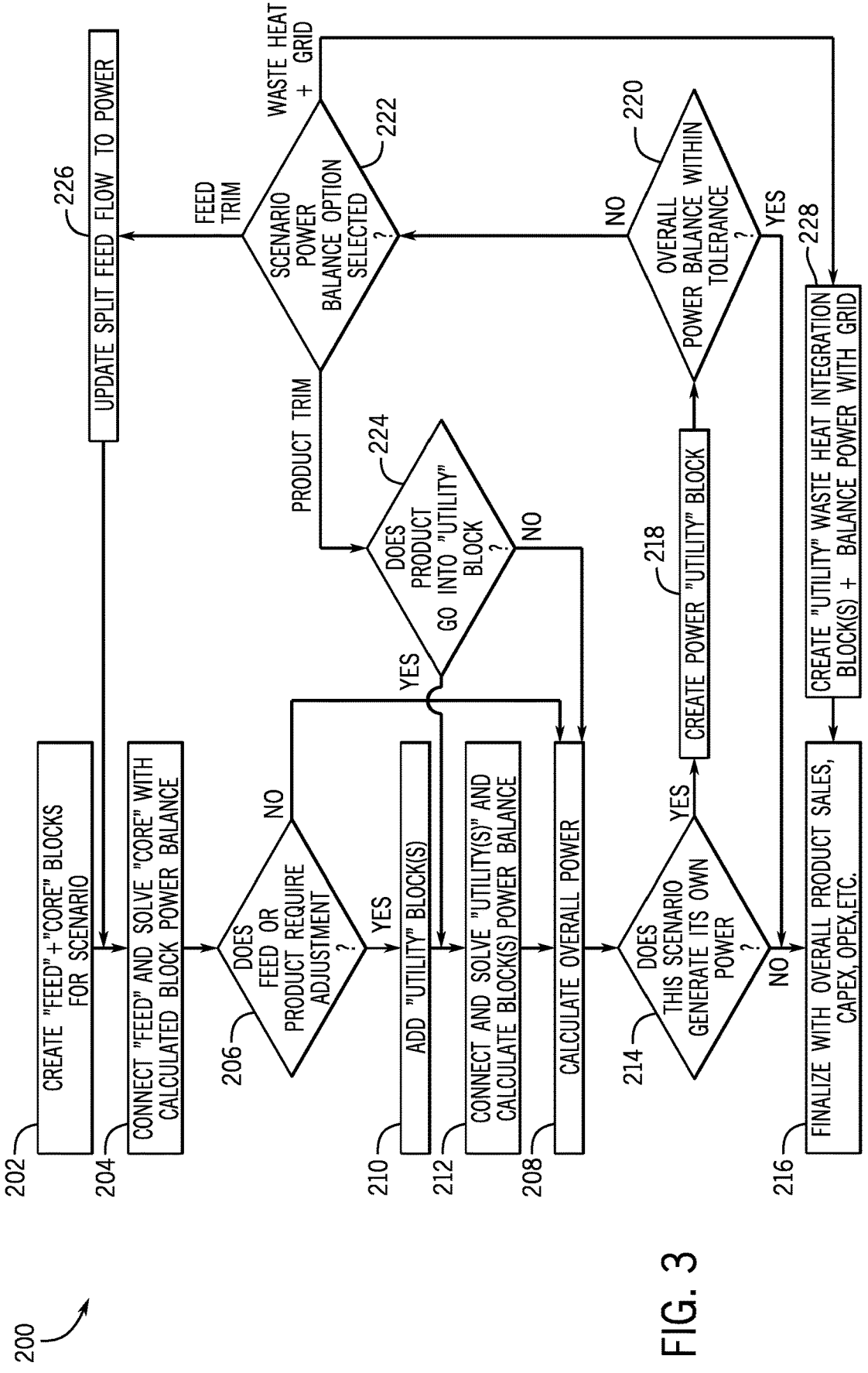
FIG. 3 illustrates a flow chart for developing the plan for utilizing excess gas of FIG. 2, in accordance with embodiments of the present disclosure.

FIG. 3 illustrates a flow chart of a process 200 for developing the plan for utilizing excess gas shown in FIG. 2. As previously described with regard to FIG. 2, the process 200 shown in FIG. 3 may be performed by one or more automated simulation engines running on one or processors of one or more computing devices. At block 202, an initial feed block and core block are generated for a particular scenario. As previously described, the feed block represents the excess gas to be utilized and the core block represents a process for turning the excess gas into a particular product. At block 204, the feed block is connected to the core block by treating outputs of the feed block as inputs to the core block to create a product. A power balance for the system is calculated based on the feed block and the core block.

At decision 206, the process 200 determines whether the feed block or the product should be adjusted based on the power balance calculation. If neither the feed block nor the product should be adjusted, the process 200 proceeds to block 208 and calculates the overall power for the system. If, at decision 206, either the feed block or the product should be adjusted, the process 200 proceeds to block 210 and adds one or more utility blocks, selected from one or more available utility blocks, to condition the feed or the product output by the core block. At block 212, the process 200 connects the one or more added utility blocks to the feed block and/or the core block and calculates the power balance for the added utility blocks. After calculating the power balance for the one or more added blocks, the process 200 proceeds to block 208 and calculates the overall power for the system.

At decision 214, the process 200 determines whether the system generates its own power. If the system does not generate its own power, the process 200 proceeds to block 216 and finalizes the system design by determining/forecasting overall product sales, capital expenditures, operating expenses, emissions, system footprint, and so forth. If the process 200 determines that the system does generate its own power, the process 200 proceeds to block 218 and adds a power generating utility block to the system.

After adding the power generating utility block to the system, the process 200 proceeds to block 220 and determines whether the overall power balance of the system is within a tolerance or some acceptable range. If the overall power balance of the system is within a tolerance or some acceptable range, the process 200 proceeds to block 216 and finalizes the system design by determining/forecasting overall product sales, capital expenditures, operating expenses, emissions, system footprint, and so forth. However, if the overall power balance of the system is not within a tolerance or some acceptable range, the process 200 proceeds to decision 222 and identifies a selected power balance option.

If product trim is the selected power balance option, the process 200 proceeds to block 224 and determines whether the product goes into a utility block to condition the product. If the product is fed into a utility block, the process proceeds to block 212, connects the utility block, and calculates the power balance for the utility block. If the product is not fed into a utility block, the process proceeds to block 208 and calculates the overall power for the system.

If, at decision 222, feed trim is the selected power balance option, the process 200 proceeds to block 226 and updates the split feed flow to power. After updating the split feed flow to power, the process 200 returns to block 204 and connects the split feed flow and the power of the feed block to the core block.

If, at decision 222, waste heat and/or grid power is the selected power balance option, the process 200 proceeds to block 228, creates a utility waste heat integration utility block, and balances the system power with grid power. After the process 200 balances the system power with grid power, the process 200 proceeds to block 216 and finalizes the system design by determining/forecasting overall product sales, capital expenditures, operating expenses, emissions, system footprint, and so forth.

Implementation of the process 200 shown in FIG. 3 may result in a possible solution for utilizing excess gas. However, in some embodiments, implementing the process 200 may not result in a possible solution if a balanced system cannot be created based on the blocks available to the process 200. In such embodiments, a core block may be identified as not being a possible solution for utilizing the excess gas.

After the process 200 has been performed for a specific core block, a new core block may be selected and the process 200 performed again for the newly selected core block. The process 200 may be repeated for each additional possible core block until the process 200 has been performed for all of the candidate core blocks representing various candidate technologies. After the process 200 has been performed for all of the candidate core blocks representing various candidate technologies, the various developed systems may be evaluated, metrics calculated, and a report generated that identifies some or all of the developed systems and provides information about the developed systems for utilizing excess gas. In some embodiments, one or more of the developed systems for utilizing excess gas may be recommended or otherwise identified as a particularly good candidate for utilizing the excess gas in question. The report may be used by a customer and/or by a service provider for making decisions and/or recommendations about how to utilize the excess gas.

Figures 4A, 4B, 4C:
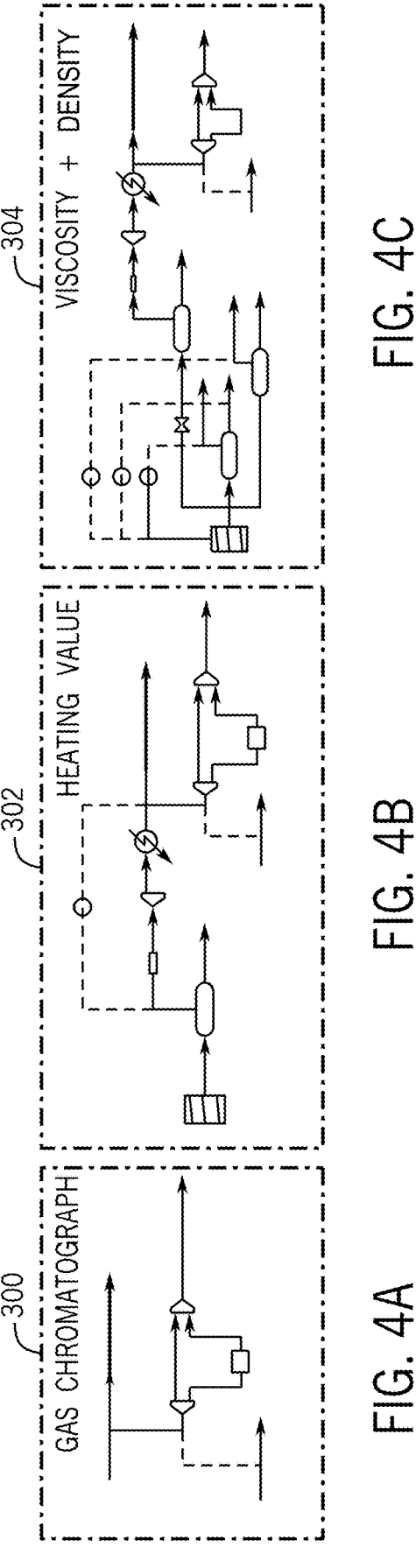
FIG. 4A illustrates a first gas feed characterization simulation block based on a first analysis of first data, which could be used in the plan of FIG. 2, in accordance with embodiments of the present disclosure.
FIG. 4B illustrates a second gas feed characterization simulation block based on a second analysis of second data, which could be used in the plan of FIG. 2, in accordance with embodiments of the present disclosure.
FIG. 4C illustrates a third gas feed characterization simulation block based on a third analysis of third data, which could be used in the plan of FIG. 2, in accordance with embodiments of the present disclosure.

FIGS. 4A-4C provide three different examples of simulation feed block models 300, 302, 304 generated for different excess gas streams based on available gas analysis. The first feed block model 300 is a gas chromatograph that outputs a stream Out-FG-1. The second feed block model 302 identifies a heating value and outputs a stream Out-FG-1. The third feed block model 304 identifies a viscosity and a density and outputs a stream Out-FG-1. Though the simulation feed block models 300, 302, 304 are generated for different excess gas streams, the simulation feed block models 300, 302, 304 provide identical compositional state representation to connected "utility", "treatment", or "core" process blocks in a developed system.

Figure 5:
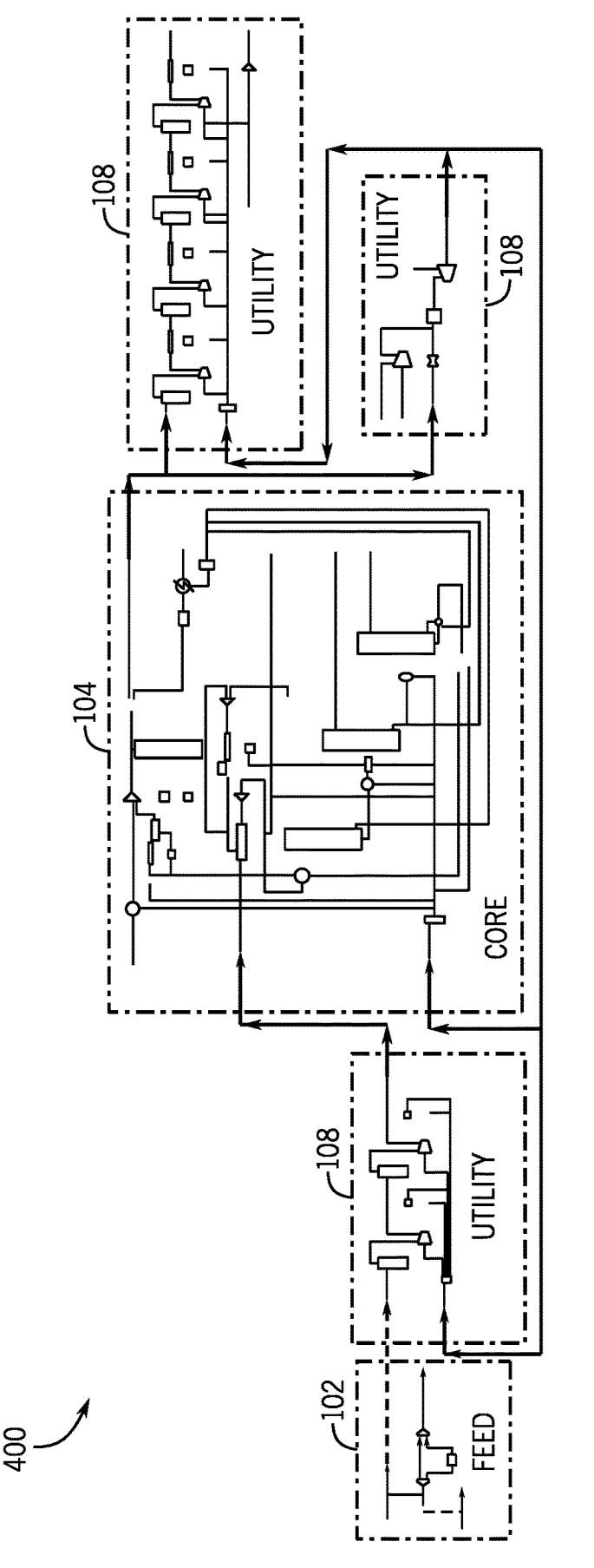
FIG. 5 illustrates a solvent extraction solution having multiple process logic blocks, in accordance with embodiments of the present disclosure.

FIG. 5 is an example of a developed system 400 in which a feed block 102 represents an excess gas. The core block 104 represents a solvent extraction process for extracting solvents from the excess gas provided by the feed block 102. As shown, the developed system 400 includes multiple utility blocks 108 disposed between the feed block 102 and the core block 104, and between the core block and the resultant product. As shown, in some embodiments, outputs from utility blocks may be fed back into other utility blocks or into the core block. The utility blocks 108 may include, for example, compression logic blocks having multiple stages of compression determined due to limitations with inner-stage temperature settings. As shown, power balance within each block may be completed and a final power balance may be performed by taking trim compressed natural gas as feed to a power generation combustion turbine. In embodiments in which overall power may be required, the developed system 400 may converge or be developed, according to the process 200 shown in FIG. 3, based on an overall error tolerance.

Figure 6:
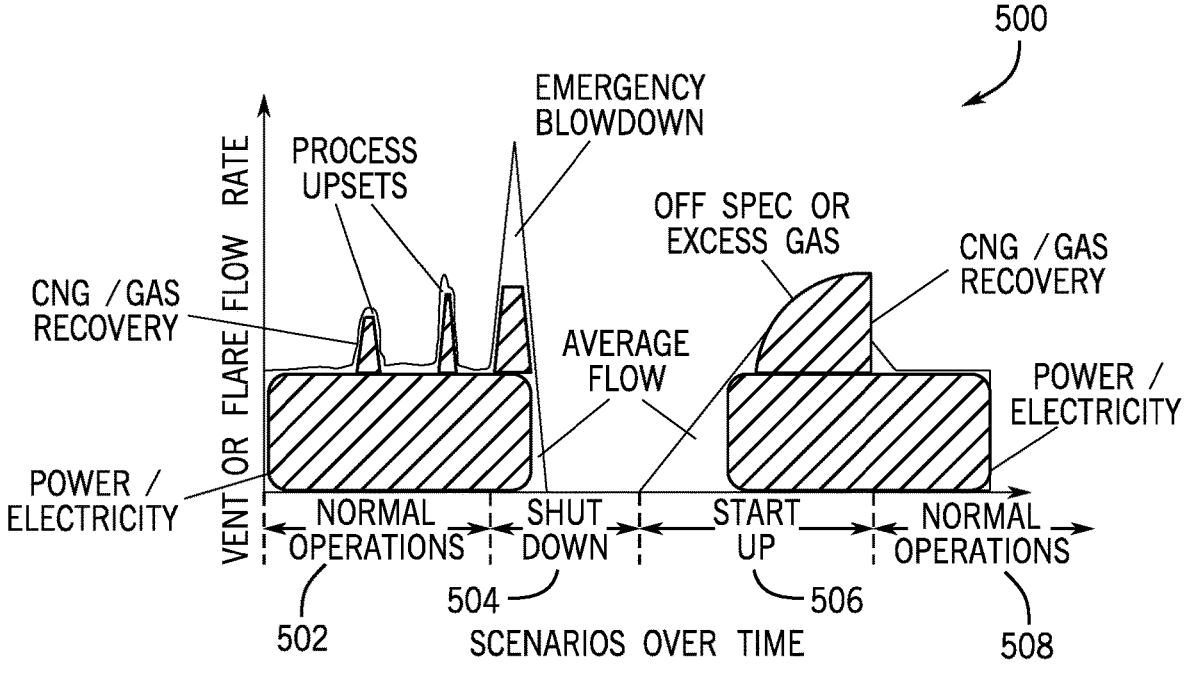
FIG. 6 illustrates possible conversion technologies depending upon the feed gas parameters according to embodiments of the present disclosure.

FIG. 6 illustrates a plot 500 of possible conversion technologies depending upon the feed gas parameters according to embodiments of the present disclosure, such as gas flow patterns. Such parameters may further include the gas source location, the average gas flow, the gas composition, the gas source lifetime, the gas source pressure, and so forth. The horizontal axis represents various scenarios over time, whereas the vertical axis represents an excess gas flow rate. Under first normal operations 502, excess gas may be combusted to generate power and/or electricity. During process upsets and/or emergency blowdowns occurring during normal operations 502, gas may be recovered, and in some embodiments compressed via compressors, and returned to the process facility for utilization. During shut down 504, the flow of excess gas via venting or flaring may fall to zero. During startup 506, the flow of excess gas via venting or flaring may increase. Upon the flow of excess gas via venting or flaring reaching a threshold rate, the excess gas may be combusted to generate power and/or electricity. If the flow of excess gas via venting or flaring continues to increase beyond the threshold rate, the additional excess gas may be recovered, and in some embodiments compressed via compressors, and returned to the process facility for utilization. As the system transitions to second normal operations 508, the flow of excess gas reaches steady state and the system returns to combusting excess gas to generate power and/or electricity The disclosed techniques offer a high-level screening that can be used to automatically calculate both macro-economic parameters (e.g. capital expenditure, operational expenses, internal rate of return, etc.), emissions results (carbon dioxide emissions & reduction, carbon dioxide emissions payments, offsets, credits, etc.), as well as other information such as weight or mass, footprint space, etc. These results might be calculated given a minimum number of parameters (e.g. feed properties, regional and economic values etc.) and can be used to identify options for a particular opportunity. In embodiments, the proposed techniques might be used for applications such as stranded gas, on-shore and off-shore vented or flared facility gas, mining applications vented gas, among other applications wherein excess gas is being produced by a primary gas or oil production facility.

Known evaluations for using to-be-flared or vented excess gas utilize a non-automated calculation limited to a handful of scenarios. The presently disclosed use custom algorithms to automatically determine and evaluate a series of scenarios (including any additional utilities, equipment, treating etc.) that can deal with a generic hydrocarbon feed and transform it into more valuable products and/or reduce the current emissions.

Additionally, the proposed method can be regularly updated to include any new or existing technology logic blocks that can be seamlessly integrated within the full solution using a compatible "process identification language".

In embodiments, the proposed method might generate a plurality of economic and emissions results for any given number of scenarios pertaining their specific assets. Moreover, for a more complex asset, where there is not one unique vented/flared stream, the proposed method could also be employed to determine which stream proves more attractive (in terms of economic or emissions factors) for immediate action.

In embodiments, the proposed method might be combined with use of the safety systems (non-assist flare, steam/gas-assist flare, incinerator for example) needed to combust emergency gas such as: disposal of gas influx during drilling, of produced gas during well testing, of flowback gas during well completion process, of natural gas diverted from processing equipment due to maintenance operations, system upset conditions or pressure release emergency.

The specific embodiments described above have been illustrated by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

In the claims, means-plus-function clauses are intended to cover the structures described herein as performing the recited function and not only structural equivalents, but also equivalent structures. Thus, for example, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

The invention claimed is:

1. A method, comprising:
   automatically determining, via one or more automated simulation engines, whether a solution for utilizing excess gas is possible by:

analyzing the excess gas to identify a type of gas as the excess gas;

setting up thermodynamic property packages provided as simulation block models to the one or more automated simulation engines, wherein the thermodynamic property packages corresponding to the type of gas identified;

automatically adding a core logic block to a system design via the one or more automated simulation engines, wherein the core logic block is representative of a process for converting the excess gas provided by a feed logic block into a product;

automatically connecting, via the one or more automated simulation engines, the core logic block to the feed logic block;

automatically identifying, via the one or more automated simulation engines, an adjustment to the excess gas provided by the feed logic block, the product produced by the core logic block, or both;

automatically adding, via the one or more automated simulation engines, a utility logic block to the system design to implement the adjustment to the excess gas provided by the feed logic block, the product produced by the core logic block, or both;

automatically connecting, via the one or more automated simulation engines, the utility logic block to the feed logic block, the core logic block, or both;

automatically determining, via the one or more automated simulation engines, a power balance for the system design as part of a recursive analysis comprising recursively analyzing and adding utility logic blocks from the simulation block models in parallel simulations performed by the one or more simulation engines until:

a balanced system is reached in which inputs, outputs, and operating conditions of all blocks meet predetermined specifications or are within acceptable ranges with respect to at least one balance factor, or the one or more automated simulation engines determine that no solution providing the balanced system can be reached;

automatically outputting, via the one or more automated simulation engines, the system design as a total facility solution comprising a second configuration of a facility inclusive of additional equipment to be utilized to achieve the total facility solution as the solution to utilize the excess gas in response to determining that the power balance for the system design meets a predetermined parameter as the balanced system; and automatically outputting, via the one or more automated simulation engines, an indication that no solution providing the balanced system is possible for utilizing the feed logic block in conjunction with the core logic block in response to determining that the power balance for the system design does not meet the predetermined parameter;

transforming the facility having a first configuration without the additional equipment into a converted facility having a second configuration inclusive of the additional equipment utilized to achieve the total facility solution as the system design; and converting the excess gas to generate an identified product comprising a fuel or a chemical in conjunction with the system design at the converted facility when the system design is automatically outputted as the total facility solution in place of flaring or venting the excess gas.

2. The method of claim 1, comprising:

adding an additional core logic block to an additional system design, wherein the additional core logic block is representative of an additional process for converting the excess gas provided by the feed logic block into an additional product;

connecting the additional core logic block to the feed logic block;

identifying an additional adjustment to the excess gas provided by the feed logic block, the additional product produced by the additional core logic block, or both;

adding an additional utility logic block to the additional system design to implement the additional adjustment to the excess gas provided by the feed logic block, the additional product produced by the additional core logic block, or both;

connecting the additional utility logic block to the feed logic block, the additional core logic block, or both;

determining an additional power balance for the additional system design; and outputting the additional system design in response to determining that the additional power balance for the additional system design meets the predetermined parameter.

3. The method of claim 2, comprising:

calculating one or more metrics for the system design and the additional system design; and generating a report that comprises the one or more metrics for the system design and the additional system design.

4. The method of claim 3, wherein the one or more metrics comprise an amount of capital expenses, an amount of operating expenses, or projected emissions, or any combination thereof.

5. The method of claim 1, wherein adding a utility logic block to the system design comprises adding a first utility logic block to implement the adjustment to the excess gas provided by the feed logic block, wherein the method comprises:

adding an additional utility logic block to the system design to implement an additional adjustment to the product produced by the core logic block; and connecting the additional utility logic block to the core logic block.

6. The method of claim 1, wherein the connecting the utility logic block to the feed logic block, the core logic block, or both, comprises connecting the utility logic block to a feed trim of the feed logic block.

7. The method of claim 1, comprising determining whether the product is input to the utility logic block when a product trim of the core logic block is selected as a power balance option.

8. The method of claim 1, wherein the core logic block, the feed logic block, and the utility logic block are defined according to a process identification language that specifies one or more characteristics of respective processes associated with the core logic block, the feed logic block, and the utility logic block.

9. A system, comprising:

a processor; and a memory, accessible by the processor and storing instructions that, when executed by the processor, cause the processor to perform operations as one or more automated simulation engines to automatically determine whether a solution for utilizing excess gas is possible, comprising:

analyzing the excess gas to identify a type of gas as the excess gas;

setting up thermodynamic property packages provided as simulation block models to the one or more automated simulation engines, wherein the thermodynamic property packages corresponding to the type of gas identified;

automatically selecting, via the one or more automated simulation engines, a core logic block from a plurality of selectable logic blocks, wherein the plurality of selectable logic blocks are defined according to a process identification language that specifies one or more characteristics of respective processes associated with the plurality of selectable logic blocks;

automatically adding, via the one or more automated simulation engines, the core logic block to a system design, wherein the core logic block is representative of a process for converting the excess gas provided by a feed logic block into a product;

automatically identifying, via the one or more automated simulation engines, an adjustment to the excess gas provided by the feed logic block, the product produced by the core logic block, or both;

automatically selecting, via the one or more automated simulation engines, a utility logic block from the plurality of selectable logic blocks to implement the adjustment to the excess gas provided by the feed logic block, the product produced by the core logic block, or both;

automatically adding, via the one or more automated simulation engines, the utility logic block to the system design;

automatically determining, via the one or more automated simulation engines, a power balance for the system design as part of a recursive analysis comprising recursively analyzing and adding utility logic blocks from the simulation block models in parallel simulations performed by the one or more simulation engines until a balanced system is reached in which:

inputs, outputs, and operating conditions of all blocks meet predetermined specifications or are within acceptable ranges with respect to at least one balance factor, or until the one or more automated simulation engines determine that no solution providing the balanced system can be reached;

automatically outputting, via the one or more automated simulation engines, the system design as a total facility solution comprising a second configuration of a facility inclusive of additional equipment to be utilized to achieve the total facility solution as the solution to utilize the excess gas in response to determining that a power balance for the system design meets a predetermined parameter as the balanced system;

automatically outputting, via the one or more automated simulation engines, an indication that no solution providing the balanced system is possible for utilizing the feed logic block in conjunction with the core logic block in response to determining that the power balance for the system design does not meet the predetermined parameter; and initiating converting the excess gas to generate an identified product comprising a fuel or a chemical in conjunction with the system design at a converted facility having a second configuration inclusive of the additional equipment utilized to achieve the total facility solution as the system design as a transformation of the facility having a first configuration without the additional equipment when the system design is automatically outputted as the solution in place of flaring or venting the excess gas at the facility.

10. The system of claim 9, wherein the operations comprise:

selecting an additional core logic block from the plurality of selectable logic blocks;

adding the additional core logic block to an additional system design, wherein the additional core logic block is representative of an additional process for converting the excess gas provided by the feed logic block into an additional product;

identifying an additional adjustment to the excess gas provided by the feed logic block, the product produced by the additional core logic block, or both;

selecting an additional utility logic block from the plurality of selectable logic blocks to implement the additional adjustment to the excess gas provided by the feed logic block, the additional product produced by the additional core logic block, or both;

adding the additional utility logic block to the additional system design; and outputting the additional system design.

11. The system of claim 10, wherein the operations comprise:

calculating one or more metrics for the system design and the additional system design; and generating a report that comprises the one or more metrics for the system design and the additional system design.

12. The system of claim 11, wherein the one or more metrics comprise an amount of capital expenses, an amount of operating expenses, or projected emissions, or any combination thereof.

13. The system of claim 9, wherein adding a utility logic block to the system design comprises adding a first utility logic block to implement the adjustment to the excess gas provided by the feed logic block, and wherein the operations comprise adding an additional utility logic block to the system design to implement an additional adjustment to the product produced by the core logic block.

14. The system of claim 9, wherein the excess gas is generated in an upstream phase, a midstream phase, a downstream phase, or any combination thereof.

15. A non-transitory, computer-readable medium storing instructions that, when executed by a processor, cause the processor to perform operations as one or more automated simulation engines to automatically determine whether a solution for utilizing excess gas is possible, comprising:

analyzing the excess gas to identify a type of gas as the excess gas;

setting up thermodynamic property packages provided as simulation block models to the one or more automated simulation engines, wherein the thermodynamic property packages corresponding to the type of gas identified;

automatically executing the one or more automated simulation engines, wherein the one or more automated simulation engines are configured to identify one or more products that can be produced using the excess gas available to a system;

automatically selecting, via the one or more automated simulation engines, a core logic block from a plurality of selectable logic blocks, wherein the plurality of selectable logic blocks are defined according to a process identification language that specifies one or more characteristics of respective processes associated with the plurality of selectable logic blocks;

automatically adding, via the one or more automated simulation engines, the core logic block to a system design, wherein the core logic block is representative of a process for converting excess gas provided by a feed logic block into a particular product of the one or more products;

automatically identifying, via the one or more automated simulation engines, an adjustment to the excess gas provided by the feed logic block, the particular product produced by the core logic block, or both;

automatically selecting, via the one or more automated simulation engines, a utility logic block from the plurality of selectable logic blocks to implement the adjustment to the excess gas provided by the feed logic block, the particular product produced by the core logic block, or both;

automatically adding, via the one or more automated simulation engines, the utility logic block to the system design;

automatically determining, via the one or more automated simulation engines, a power balance for the system design as part of a recursive analysis comprising recursively analyzing and adding utility logic blocks from the simulation block models in parallel simulations performed by the one or more simulation engines until a balanced system is reached in which:

inputs, outputs, and operating conditions of all blocks meet predetermined specifications or are within acceptable ranges with respect to at least one balance factor, or until the one or more automated simulation engines determine that no solution providing the balanced system can be reached; and automatically outputting, via the one or more automated simulation engines, the system design as a total facility solution comprising a second configuration of a facility inclusive of additional equipment to be utilized to achieve the total facility solution as the solution to utilize the excess gas in response to determining that a power balance for the system design meets a predetermined parameter as the balanced system;

automatically outputting, via the one or more automated simulation engines, an indication that no solution providing the balanced system is possible for utilizing the feed logic block in conjunction with the core logic block is available in response to determining that the power balance for the system design does not meet the predetermined parameter; and initiating converting the excess gas to generate an identified product comprising a fuel or a chemical in conjunction with the system design at a converted facility having a second configuration inclusive of the additional equipment utilized to achieve the total facility solution as the system design as a transformation of the facility having a first configuration without the additional equipment when the system design is automatically outputted as the solution in place of flaring or venting the excess gas at the facility.

16. The non-transitory, computer-readable medium of claim 15, wherein the operations comprise connecting the utility logic block to a feed trim of the feed logic block.

17. The non-transitory, computer-readable medium of claim 15, wherein the operations comprise determining whether the product is input to the utility logic block when a product trim of the core logic block is selected as a power balance option.

18. The non-transitory, computer-readable medium of claim 15, wherein the operations comprise connecting the utility logic block to a grid power source.

19. The non-transitory, computer-readable medium of claim 15, wherein the operations comprise connecting the utility logic block to a waste heat source.

20. The non-transitory, computer-readable medium of claim 15, wherein the operations comprise:

calculating one or more metrics for the system design, wherein the one or more metrics comprise an amount of capital expenses, an amount of operating expenses, or projected emissions, or any combination thereof; and generating a report that comprises the one or more metrics for the system design.

* * * * *